United States Patent [19]

Gibbons

[11] Patent Number: 4,536,785

[45] Date of Patent: Aug. 20, 1985

[54] ONE TRANSISTOR DYNAMIC RANDOM ACCESS MEMORY

[76] Inventor: James F. Gibbons, 320 Tennyson Ave., Palo Alto, Calif. 94301

[21] Appl. No.: 526,912

[22] Filed: Aug. 26, 1983

[51] Int. Cl.³ .............................................. H01L 29/34
[52] U.S. Cl. ...................... 357/54; 357/23.1; 357/23.6; 357/23.7; 357/4
[58] Field of Search ............... 357/23 R, 23 C, 23 TF, 357/4, 54

[56] References Cited

U.S. PATENT DOCUMENTS

| | | | |
|---|---|---|---|
| 2,773,250 | 12/1956 | Aigrain et al. | 357/4 |
| 3,566,217 | 2/1971 | Cooper | 357/4 |
| 3,969,753 | 7/1976 | Thorsen, Jr. et al. | 357/23 TF |
| 4,250,569 | 2/1981 | Sasaki et al. | 357/23.7 |
| 4,371,955 | 2/1983 | Sasaki | 357/23.6 |
| 4,462,090 | 7/1984 | Iizuka | 357/54 |

OTHER PUBLICATIONS

R. D. Jolly et al., IEEE Electron Device Letters, vol. EDL-4, No. 1, Jan. 1983.

*Primary Examiner*—Martin H. Edlow
*Assistant Examiner*—Lamarr A. Brown
*Attorney, Agent, or Firm*—Flehr, Hohbach, Test, Albritton & Herbert

[57] ABSTRACT

A dynamic random access memory cell including a storage capacitor defined by an electrode and dielectric layers on both sides of said electrode and a transistor for controlling the charge on said storage capacitor.

6 Claims, 3 Drawing Figures

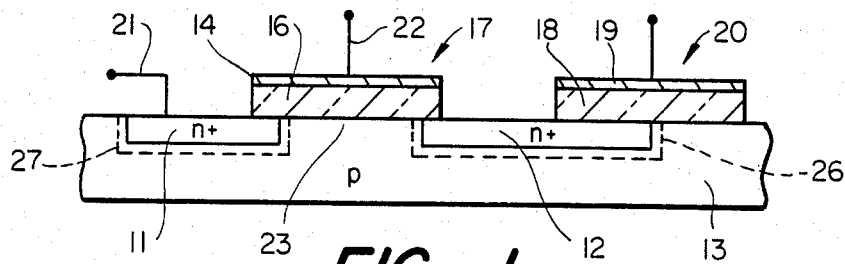
FIG_1
(PRIOR ART)
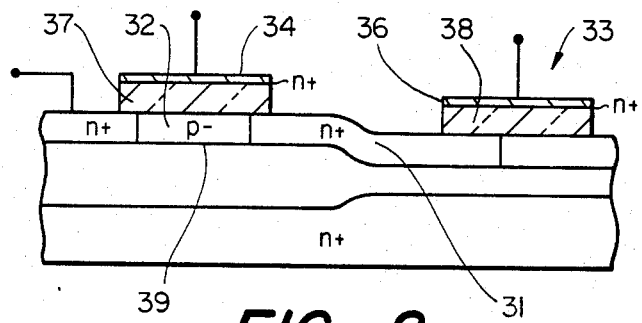
FIG_2
(PRIOR ART)
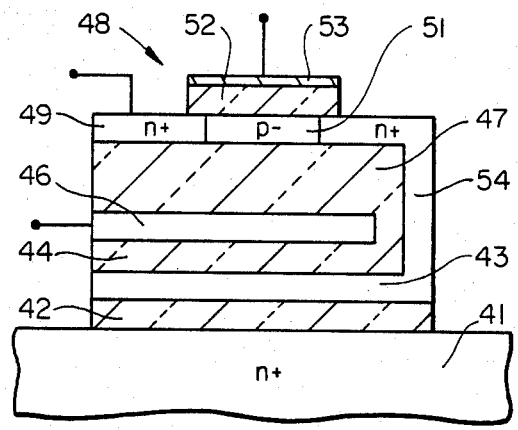
FIG_3

ONE TRANSISTOR DYNAMIC RANDOM ACCESS MEMORY

This invention relates generally to random access memories (RAMS) and more particularly to dynamic access memories (DRAMS).

Conventional DRAMS are made as shown in FIG. 1, including spaced inset semiconductor regions of one conductivity type 11 and 12 in a semiconductor substrate of opposite conductivity type 13. A metal 14 over oxide 16 forms an input field effect transistor 17. A storage capacitor 20 is formed by the inset region 12, oxide 18 and metal 19. A signal on bit line 21 is stored as charge in the storage capacitor by applying a voltage to the word line 22 which causes the FET 17 to form a channel in the substrate portion 23 and permits charge transfer to the capacitor. The transistor 17 is then turned off and the charge is stored in the capacitor 20. To read out the information the transistor 17 is energized to form a channel and charge is transferred to the bit line where a voltage will appear. Many circuits of this type can be formed in a semiconductor wafer to provide a high density short term memory useful in digital computers and the like.

The prior art DRAMS have certain drawbacks: (1) Leakage currents developed in the space charge region 26 discharge the storage capacitor 20; (2) The device has poor alpha particle community because charges generated by an alpha particle can be collected in the space charge region or depletion layer 26 and discharge to storage capacitor 20; and, (3) The region 11 has a space charge or depletion region 27 which has a capacitance that is larger than desirable, since device size is determined by the ratio of the storage capacitance to this capacitance. This means a large storage capacitor area.

An improvement to this structure has been proposed by R. D. Jolly, T. I. Kamins and R. H. McCharles in IEEE Electron Device Letters Volume EDL-4, No. 1, January 1983. The proposed structure is shown in FIG. 2. The cell is fabricated from a layer 31 of beam-recrystallized polysilicon of one conductivity type with a region of opposite conductivity type 32 in which a channel or inversion layer is formed. The storage region 33 includes oxide on both sides of the layer 31 which essentially doubles the capacitance. The conductive layers 34 and 36 overlying the oxide regions 37 and 38 were formed of fine-grain polysilicon. Isolation of the storage regions by oxides reduces the susceptibility of the cell to soft errors from collection of charge injected into the substrate by surrounding elements or by alpha particles. Bit line capacitance is reduced by the thick oxide further increasing the ratio of storage capacitance to bit line capacitance.

A disadvantage with the cell proposed by Jolly et al. is that the lower surface 39 of the FET formed in the layer 31 leaks and reduces refresh time. This problem may be reduced by holding the substrate at a large negative voltage when charge is stored in the storage capacitor. However, maintaining the substrate at a high negative voltage is not acceptable in many applications.

It is an object of the present invention to provide an improved dynamic random access memory cell.

It is another object of the present invention to provide an improved compact dynamic random access memory cell.

The foregoing and other objects of the invention are achieved by a dynamic random access memory which includes a substrate; a first insulating high dielectric layer on one surface of said substrate; a conductive storage electrode carried by said first insulating layer; a second insulating layer on at least said storage electrode; a capacitor plate on said second insulating layer opposite and spaced from said storage electrode whereby said capacitor plate, storage electrode, substrate and insulating plates form a storage capacitor; an oxide layer over said plate; an access transistor including a thin layer of semiconductor material including spaced regions of one conductivity type separated by a region of opposite conductivity type and means for inducing an inversion layer in said region of opposite conductivity type, said transistor carried by said oxide layer opposite the capacitor plate; and, means for connecting said transistor to said storage electrode.

The invention will more clearly be understood with reference to the drawings in which:

FIG. 1 is a sectional view of a conventional dynamic random access memory cell;

FIG. 2 is a sectional view of an improved prior art dynamic random access memory cell; and FIG. 3 is a sectional view of a dynamic random access memory cell in accordance with the present invention.

Referring to FIG. 3 the dynamic RAM includes a substrate 41 of semiconductor material of one conductivity type. A thin oxide layer 42 is formed on one surface of the substrate by conventional techniques. A storage electrode 43 is formed on the oxide layer. The electrode may be fine-grain polysilicon, recrystallized polysilicon, or metal. A thin oxide layer 44 is formed on the surface of the device embedding the electrode 43. A capacitor plate 46 is then formed on the surface of the oxide 44 by suitable depositing, masking and etching steps. The capacitor plate may be metal or polysilicon. Oxide is again grown to embed the capacitor plate 46 and form a thick oxide layer 47 overlying the plate. A transistor 48 is then formed on the surface of the oxide layer 47 as by depositing a thin polysilicon layer 49 and beam recrystallizing the layer. A region of opposite conductivity type 51 is then formed in the layer by diffusion or ion bombardment to provide two regions of one conductivity type separated by a region of opposite conductivity type. The transistor is operated by forming an inversion layer in the region 51. This can be achieved by depositing an oxide layer 52 with a conductive plate or region 53 which may be polysilicon or metal. The transistor 48 is connected to the storage electrode by a conductive connector 54 which extends through the oxide. The connector 54 may be polysilicon or metal.

The capacitor plate 46 is opposite the lower surface of the access transistor. A negative voltage can be applied to the plate and shut off lower surface conduction in the transistor. This increases refresh time as compared to the prior art. The plate provides thermal isolation of the oxide layers 42 and 44 and the substrate 41 when the polysilicon layer forming the transistor 48 is recrystallized. This is important to keep the properties of the oxide layers and substrate from degrading.

It is possible to increase the capacitance of the storage capacitor by using ferroelectric materials with high dielectric constant such as barium titinate. The plate would provide thermal isolation to the ferroelectric material and preserve its properties. The ferroelectric improvement is also applicable to the oxide layers of the storage capacitor of FIG. 2.

Thus there has been provided an improved compact dynamic random access memory cell having improved characteristics.

What is claimed:

1. A dynamic random access memory cell comprising a substrate;
a first insulating high dielectric layer having one surface on one surface of said substrate;
a conductive storage electrode on the other surface of said first insulating layer;
a second insulating layer having one surface on said storage electrode;
a capacitory plate on the other surface of said second insulating layer opposite and spaced from said storage electrode whereby said capacitor plate, storage electrode, substrate and insulating plates form a storage capacitor;
an oxide layer having one surface on said plate;
an access transistor including a thin layer of semiconductor material including spaced regions of one conductivity type separated by a region of opposite conductivity type and means for inducing in inversion layer in said region of opposite conductivity type, said transistor carried by the other surface of said oxide layer opposite the capacitor plate; and, means for electrically connecting said transistor to said storage electrode.

2. A dynamic random access memory as in claim 1 in which said first and second insulating layers are ferroelectric material.

3. A dynamic random access memory as in claim 1 in which said first and second insulating layers are oxide layers.

4. A dynamic random access memory as in claim 1 in which said transistor includes an oxide layer extending over said region of opposite conductivity type and a conductive electrode on said oxide layer.

5. A dynamic random access memory as in claim 1 in which said connecting means and said storage electrode are polysilicon.

6. A dynamic random access memory cell including a storage capacitor defined by a storage electrode, ferroelectric layers on both sides of said storage electrode and conductive means and a transistor for controlling the charge in said storage capacitor.

* * * * *